United States Patent [19]

Nakasugi et al.

[11] Patent Number: 4,588,288
[45] Date of Patent: May 13, 1986

[54] STATIC PRESSURE BEARING AND TRANSPORT DEVICE UTILIZING THE SAME

[75] Inventors: Mikio Nakasugi, Tokyo; Takao Yokomatsu, Yokohama; Junji Isohata, Tokyo, all of Japan

[73] Assignee: Canon Kabushiki Kaisha, Tokyo, Japan

[21] Appl. No.: 623,473

[22] Filed: Jun. 22, 1984

[30] Foreign Application Priority Data

Jul. 1, 1983 [JP] Japan ............................ 58-119679
Jul. 1, 1983 [JP] Japan ......................... 58-102261[U]

[51] Int. Cl.⁴ ...................... G03B 27/42; F16C 32/06
[52] U.S. Cl. ...................................... 355/53; 384/122
[58] Field of Search ...................... 355/53, 54, 86, 95; 308/5 R; 384/122

[56] References Cited

U.S. PATENT DOCUMENTS

| | | | |
|---|---|---|---|
| 4,370,054 | 1/1983 | Isohata et al. | 355/53 |
| 4,422,754 | 12/1983 | Isohata et al. | 355/53 |
| 4,496,239 | 1/1985 | Isohata et al. | 355/53 X |
| 4,504,048 | 3/1985 | Shiba et al. | 308/5 R X |

FOREIGN PATENT DOCUMENTS 56-17341  2/1981  Japan ..................... 355/53

Primary Examiner—L. T. Hix
Assistant Examiner—D. Rutledge
Attorney, Agent, or Firm—Fitzpatrick, Cella, Harper & Scinto

[57] ABSTRACT

There is disclosed a static pressure bearing which is provided with plural fluid supplying pads for supplying a fluid in a gap between a guide member and a bearing member whereby the ratio of the change of pressure of the fluid supplied from the pads to the change in the gap is regulatable.

7 Claims, 10 Drawing Figures

STATIC PRESSURE BEARING AND TRANSPORT DEVICE UTILIZING THE SAME

BACKGROUND OF THE INVENTION

1. Field of the Invention

The present invention relates to a static pressure bearing and a transport device utilizing the same, and more particularly to such a static pressure bearing and transport device adapted for use in a semiconductor device producing apparatus.

2. Description of the Prior Art

In a static pressure fluid bearing, in case of regulating the distance between the fluid emitting pads and the supporting surface by means of a change in the fluid supply pressure, it is desirable that the ratio or sensitivity of change in said distance to the change of fluid supply pressure be regulatable. Generally a change in the fluid supply pressure to the pads causes a change in the distance between the pads and a supporting surface, but it was found that a change in distance resulting from a supply pressure change by 500 $g/cm^2$ from 5 $kg/cm^2$ is different from that caused by a supply pressure change of 500 $g/cm^2$ from 4 $kg/cm^2$. In this manner the sensitivity varies according to the reference pressure. Also in such a bearing, the sensitivity is inevitably unstable if the fluid pressure is controlled only in the region of the gap. Thus, although the sensitivity control itself is important, it is necessary for this purpose to strictly control the flatness of guide members, dimensional precision of sliding parts and pads, and rigidity and floating force of the pads. However such control of the error or fluctuation in the precision of component parts or in the characteristic of pads practically has certain limitations, and inevitably reduces the productivity.

On the other hand, the production technology for integrated circuits and large-scale integrated circuits in the semiconductor industry is showing remarkable progress. In such production, a process of printing a circuit pattern of a photomask onto a photosensitive layer of a wafer required a particularly advanced optical technology since the line width constituting said circuit pattern is of sub-micron dimension. For this purpose there is already known, for example, an exposure apparatus in which large convex and concave mirrors are positioned in mutually opposed manner to form an image of real size by a light beam repeatedly reflected between said mirrors and to intercept said beam, except at an annular field, of satisfactory image quality thereby scanning the mask and wafer respectively placed on the object plane and image plane.

In such exposure apparatus the highly precise transportation of mask and wafer is an essential factor for satisfactory image formation, and for this purpose the Japanese Patent Laid-open Sho54-53867 proposes a transport device. However the guide rails guiding the members to be transported can hardly achieve highly precise linearity because of the required considerable length, and are unable to maintain the linearity for prolonged periods. Consequently the mask and wafer sliding along such guide rails may locally be inclined two-dimensionally to generate aberration in the image, thus hindering improvement in the performance of the semiconductor device.

The Japanese Patent Laid-open Sho58-25637 of the present applicant discloses compensation for non-linearity of the guide rails by providing the member transported along the guide rails with floating elements, such as plural air pads of inverted saucer shape for emitting air of a determined pressure and varying the distance to the guide rails by regulating the floating force of said pads thereby controlling the position of said member.

However simultaneous control of the floating force of plural floating elements tends to result in yawing and rolling in the transported member if the precision of the guide rails or the combined precision of the guide rails and floating members is insufficient or if the performance of plural floating elements is not uniform.

SUMMARY OF THE INVENTION

An object of the present invention is to provide a static pressure bearing capable of satisfactorily controlling the sensitivity regardless of eventual errors in the component parts.

Another object of the present invention is to provide a transport device capable of ensuring highly precise transportation and a semiconductor device producing apparatus utilizing said transport device.

DETAILED DESCRIPTION OF THE PREFERRED EMBODIMENTS

Figure 1:
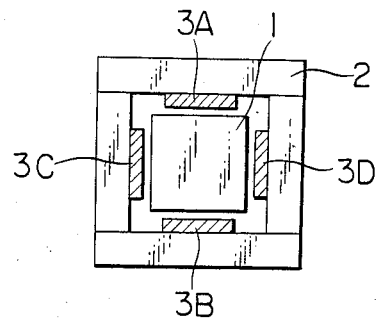
FIG. 1 is a front view of a bearing of the present invention.
Figure 2:
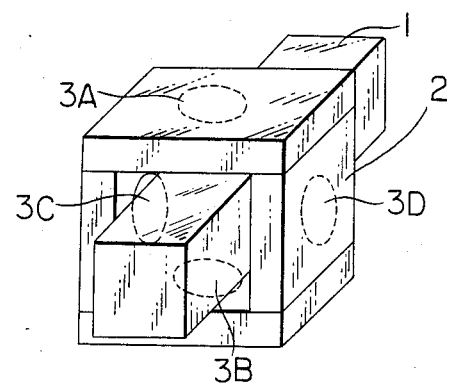
FIG. 2 is a perspective view thereof.

FIGS. 1 and 2 show a linear bearing respectively seen from the axial direction and from a diagonal direction. In these drawings there is shown an elongated guide or shaft member 1 of which lateral faces constitute guide faces. A sliding frame 2 is internally provided with air-emitting guide pads 3A–3D which are respectively connected to unrepresented flexible ducts in turn connected to an air compressor through pressure control valves. Of these pads, 3A and 3B support the sliding frame 2 in the vertical direction while 3C and 3D support the same in the horizontal direction. Thus the sliding frame 2, being supported by air pressure, moves without friction when subjected to an external force in the axial direction.

Now let us consider the pads 3C, 3D in the horizontal direction. The position of the sliding frame 2 in the horizontal direction is determined by gaps at the left and right of the pads 3C, 3D respectively with the lateral faces of the guide member 1, and said gaps depend on the air pressures supplied to the pads 3C, 3D. If the air pressure to the right pad 3D is increased while that to the left pad 3C is maintained constant, the gap between the right pad 3D and the guide member 1 increases while the gap between the left pad 3C and the guide member 1 decreases. Consequently, even if the guide member 1 is slightly bent by an error at the production, the sliding frame can be moved linearly by suitable control of the air supply to the pads 3C, 3D. It is also possible to change the movement of the sliding frame, if necessary, with respect to a linear guide member.

It has however been found, in the control of the air pressure, that the behavior obtained by changing the air pressure on only one side is different from that obtained by differential pressure change on both sides with a constant total pressure (for example a change of 1 atmosphere being obtained by a pressure increase of 0.5 atmospheres on one side and a pressure decrease of 0.5 atmospheres on the other side).

Figure 3:
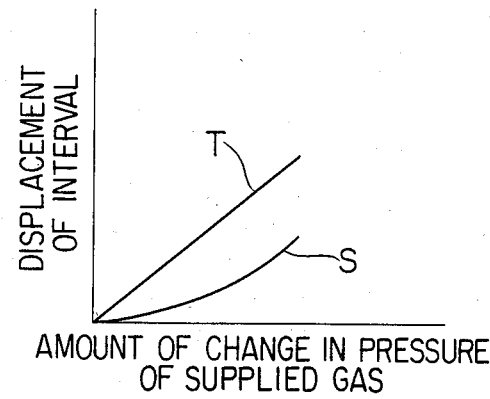
FIG. 3 is a chart showing the gap change as a function of the fluid pressure change.

FIG. 3 shows such behaviors. A curve S, corresponding to the case of changing the air pressure on one side only, shows a tendency that the amount of positional change of the sliding frame in response to a given change of the air pressure increases with the air pressure. On the other hand, in case of a curve T in which the air pressure is changed in a differential manner, the positional control of the sliding frame is quite easy since the amount of change of the gap is substantially proportional to the amount of change of the air supply pressure.

Figure 4:
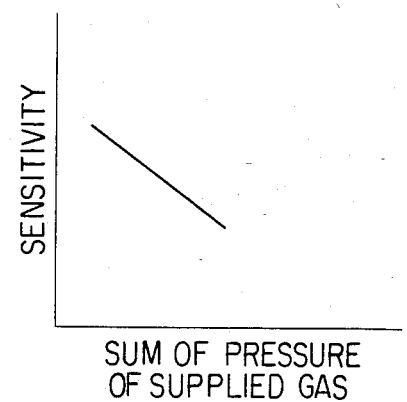
FIG. 4 is a chart showing the sensitivity as a function of the sum of the supplied pressure.

However the sensitivity depends on the reference pressure, so that, for example the sensitivity for a differential pressure change of 1 kg/cm$^2$ with a total air pressure of 7 kg/cm$^2$ is different from that for a differential pressure change of 1 kg/cm$^2$ with a total air pressure of 6 kg/cm$^2$. Such situation is shown in FIG. 4 indicating that the sensitivity decreases or increases when the sum of the air pressures at left and right respectively increases or decreases. Thus, in case of moving the sliding frame 2 by a distance d in the horizontal direction after a movement over a distance 1 along the guide member 1 in the bearing shown in FIG. 1, the sum of air pressures in selected to be low, if the sensitivity is to be low, in order to obtain a sufficient compensation, or said sum is selected to be high, if the sensitivity is to be high, in order to avoid excessive compensation.

Figure 5:
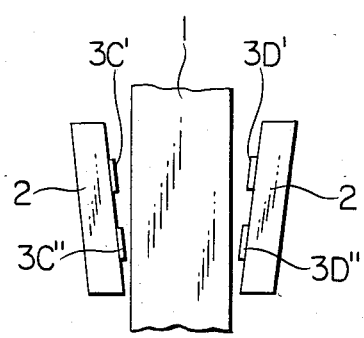
FIGS. 5, 6 and 7 are cross-sectional views showing applications of the present invention.

FIG. 5 shows a case of compensating for an error in assembly by the above-described method, in which it is assumed that the sliding frame 2 is a slightly widened assembly toward the direction of movement thereof. There are provided pads 3C', 3C'', 3D' and 3D''. The distance of the front pads 3C', 3D', shown at the top in the drawing, to the guide member 1 is different from that of the rear pads 3C'', 3D'' to the guide member 1, and the sensitivity is higher where the distance is smaller even if the air pressure is same.

Thus if the pressure is controlled from the same reference pressure for the front (top) and rear (bottom) pads in the course of movement of the sliding frame 2, the movement becomes unbalanced because the difference in the sensitivity between the front and rear pads results in a difference of the amount of translation per unit amount of movement, or of the resolving power. Therefore, the resolving power can be regulated to the same level for the front and rear pads either by fixing the sum of pressure supplied to the rear pads and reducing the sum of pressures supplied to the front pads to increase the sensitivity thereof, or by reducing the sum of pressures supplied to the front pads and increasing the sum of pressure supplied to the rear pads, or by fixing the sum of pressures supplied to the front pads and increasing the sum of pressures supplied to the rear pads. In the foregoing example the pads are positioned horizontally, but a similar solution can be adopted for vertically positioned pads.

In addition to the dimensional error of the sliding frame, guide member or pads explained above, the sensitivity difference between the front and rear pads may result also from fluctuation in the rigidity or floating force of the pads which eventually provides a sensitivity outside the designed range. Also in such case the sensitivity of the front and rear pads can be regulated to a value matched with the designated speed of the sliding frame either by increasing the sum of pressures supplied to an opposed pair of pads across the guide member to decrease the sensitivity or reducing the sum of pressures supplied to the opposed pairs of pads to increase the sensitivity thereof.

Figure 6:
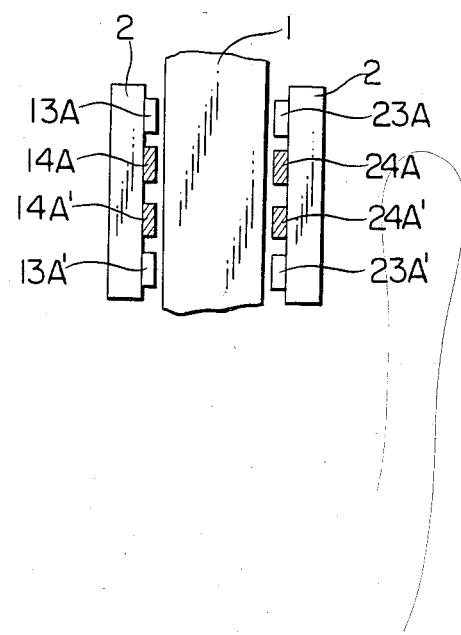

FIG. 6 shows a bearing provided with four opposed pairs of pads, in which pairs 13A, 23A and 13A', 23A' receive pressures requlated along the movement of the sliding frame 2, while pairs 14A, 24A and 14A', 24A' receive fixed pressures. If a designed sensitivity cannot be obtained by the characteristics of the pads, the sum of pressures supplied to the pair 13A, 23A or 13A', 23A' may be respectively increased or decreased to regulate the sensitivity. Such sensitivity regulation can also be attained by increasing or decreasing the sum of pressures supplied to the pair 14A, 24A or 14A', 24A'.

Figure 7:
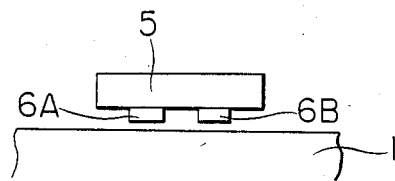

FIG. 7 shows a bearing rotatable in a plane provided with a guide member 1 with a planar upper surface, and a rotary plate 5 which is equipped with pads 6A, 6B, ... arranged in axially symmetric manner and is rotatable about a vertical axis. In such structure, a slight inclination of the rotary plate 5 can be created by creating a difference in the pressures supplied to the pads 6A, 6B, and the sensitivity, if not adequate, can be regulated by increasing or decreasing the sum of pressures supplied to the pads 6A, 6B. For example a pressure difference of 1 kg/cm$^2$ for a pressure sum of 10 kg/cm$^2$ can be created by adding and subtracting 0.5 kg/cm$^2$ to and from the reference pressure 5 kg/cm$^2$, thus obtaining a pressure of 4.5 kg/cm$^2$ for one pad and 5.5 kg/cm$^2$ for the other. However if the sensitivity is excessively low, said reference pressure is changed to 4.5 kg/cm$^2$ on which the pressure is regulated by 0.5 kg/cm$^2$ so that the pads respectively receive 5 kg/cm$^2$ and 4 kg/cm$^2$ whereby the rotary plate can be inclined with a desired sensitivity.

As explained in the foregoing, the present invention achieves desired control of the sensitivity even when the sensitivity involves fluctuation due to an error in the gap between the guide member and the pads caused by insufficient dimensional precision of the guide member, sliding frame or pads due to uneven rigidity or floating force of the pads. Also the present invention mitigates undesirable movement such as yawing, pitching or rolling resulting from differences in the sensitivity of plural pairs of pads.

Figure 8:
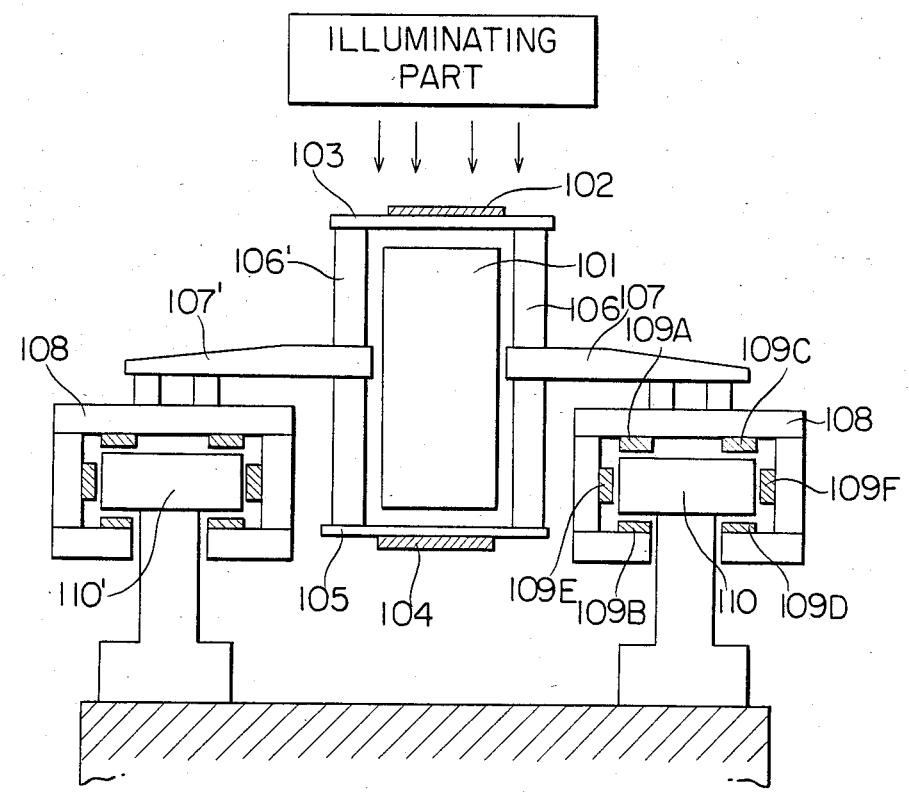
FIG. 8 is a schematic view of a semiconductor device producing apparatus.
Figure 9:
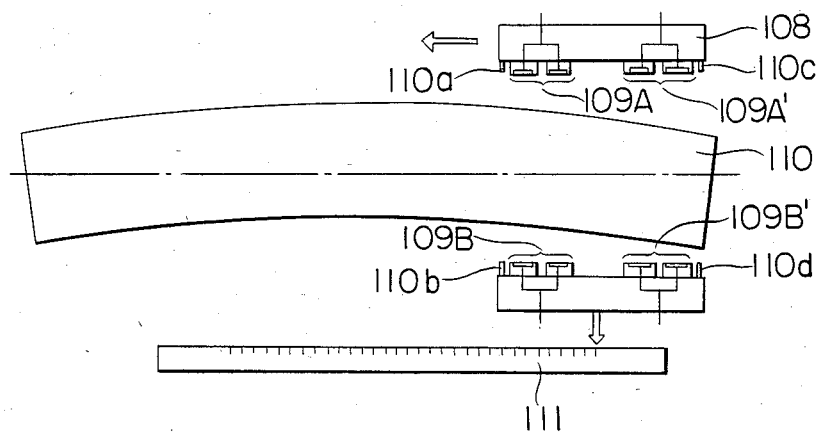
FIG. 9 is a schematic view showing the principle of control of the transport device.

FIG. 8 shows a transport device for a projection exposure apparatus, and FIG. 9 shows the principle of compensation in case the guide rails are bent in the vertical direction.

In the present text there will be given only a schematic explanation since a detailed explanation is already given in the specification of the Japanese Patent Laid-open publication cited before. The compensating operation explained herein is also applicable in case the guide rails, even if linear, deviate from reference lines by an error in the assembly or are intentionally bent in order to compensate for distortion in the imaging performance of the projection system.

In FIG. 8 there are shown a projection system 102 which can be composed of lenses or of a combination of concave and convex mirrors; a mask 101 illuminated by light from an illuminating unit; a mask holder 103 for supporting the mask 102; a wafer 104 supported by a wafer holder 105; linking frames 106, 106' for integrally linking the mask holder 103 with the wafer holder 105; supporting bar 107, 107'; supporting frames 108, 108' on which the supporting bars 107, 107' support the linking frames 106, 106'; and pads 109A-109F fixed on the internal faces of the transport frames 108, 108' to face the lateral faces of guide rails 110.

The pads 109A-109F (only one set of which will be explained) are connected to an air compressor through flexible ducts. In the above-described structure, the transport frames 108, 108' float on the guide rails 110, 110' by the supply of a determined pressure to the pads 109A-109F, so that the mask 102 and the wafer 104 respectively run in the object plane and the image plane of the projection system 101 at a constant speed if a force perpendicular to the plane of drawing is applied continuously to the link frames 106, 106'. If the distance between the faces of the guide rails and the pads is maintained constant while the guide rails are bent as shown in FIG. 9, the transport frames 108, 108' will show upward and downward inclination, thus generating a distortion in the mask pattern on the wafer 104.

There are therefore provided non-contact distance sensors 110a–110d, for example electric micrometers for measuring the gaps as shown in FIG. 9, and the pressures supplied to the pads are controlled as a function of time, based upon the predetermined deviation from the linearity. More specifically, a distance sensor 111 measures the amount of movement of the transport frames 108 from the start point, and the pads are given pressures which are determined by the position of said frames in relation to the deviation at said position. For example, at the illustrated position of the transport frame 108, the front pads 109A receive a smaller pressure than that supplied to the rear pads 109A' in order to reduce the distance between the front pads 109A and the guide rail 110 compared with distance between the rear pads 109A' and the guide rail 110. Similarly the pressure to the front pads 109B should be larger than that supplied to the rear pads 109B'. Furthermore the pressures supplied to the upper and lower pads are suitably controlled in order to regulate the vertical position of the transport frame 108. The distance sensors 110a–110d perform feedback control on the pressures supplied to the pads in order to attain predetermined distances. In this manner the transport frame 108 moves in the horizontal direction with high precision under the pressure control explained above.

In the foregoing explanation, the present invention is related to the control in the vertical direction, but the same principle is applicable also to the control in the horizontal direction.

Figure 10:
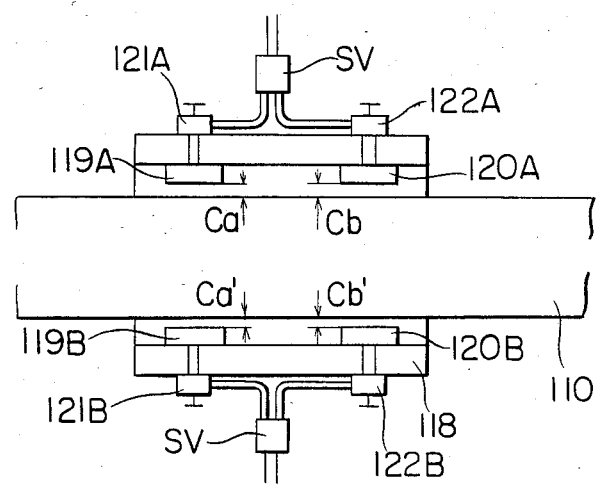
FIG. 10 is a schematic view of an embodiment of the present invention.

FIG. 10 shows, as an example, front pads 119A, 119B, 120A, 120B which are fixed on a mounting frame 118 in turn fixed on the transport frame (not shown).

Ca, Ca', Cb, Cb' represent distances of the pads and the guide rail. The distances Ca, Cb increase by increasing the pressures supplied to the upper pads 119A, 120A or decreasing the pressures supplied to the lower pads 119B, 120B, and the distances Ca', Cb' increase by increasing the pressures supplied to the pads 119B, 120B or decreasing the pressures supplied to the pads 119A, 120A. Such pressure difference may be generated in a differential manner.

In case the pads 119A and 120A receive air supplied through a servo valve SV while the pads 119B and 120B receive air supplied similarly through another servo valve SV, a given change in the pressure may not result in a constant change in the distance because Ca+Ca' is not equal to Cb+Cb' due to unparallel assembly of the mounting frame or because of uneven floating characteristics of the pads. Stated differently, the sensitivity may not be uniform. In such case, a pressure increase in the upper pads 119A, 120A through the servo valve at a certain position of the transport frame should bring the distances Ca, Ca' simultaneouly to designed values, but in practice there results a difference between said distances, thus leading to a pitching phenomenon. Similarly a difference in the sensitivity of the pads arranged horizontally leads to a yawing phenomenon.

In the embodiment of the present invention shown in FIG. 10, the supply ducts of the pads are respectively provided with choke valves 121A, 121B, 122A, 122B which are independently controllable. Thus, if the sensitivity of the pad 120A is higher than that of other pads, the choke valve 122A connected to said pad 120A is choked in such a manner that the sensitivity of said pad 120A becomes equal to that of other pads. On the other hand, if the sensitivity of the pad 120A is lower than that of other pads, the choke valves 121A, 121B, 122B connected to the pads 119A, 119B, 120B are choked to obtain a uniform sensitivity and the air pressures supplied to the upper and lower pads are slightly increased. It is also possible to initially maintain all the choke valves in a state choked to a certain degree, and to open or close individual valves according to the sensitivity thereof.

The above-described control provides a uniform sensitivity in all the pads, thereby ensuring smooth movement of the members to be transported and achieving compensation for linearity.

Also the above-mentioned method can be applied to the integral transportation of the mask and wafer in an exposure apparatus, whereby the member in transportation is freed from pitching, yawing and rolling phenomena and ensures satisfactory replication of the circuit pattern from the mask onto the wafer. Thus this invention not only improves the yield of production but also ensures faithful replication of complicated circuit patterns, thus facilitating integration of a higher degree.

As explained in the foregoing, the present invention improves the running performance of a transported member through the use of a fluid and further improves the control performance, by means of an extremely simple structure.

What we claim is:

1. A static pressure bearing comprising:
   a shaft member;
   a bearing member supported in spaced relation on said shaft member;
   plural fluid supply means for supplying pressurized fluid in a gap between said shaft member and said bearing member; and
   means for controlling said plural fluid supply means to regulate the ratio of the change in dimension of said gap to the change in pressure of said supplied fluid.

2. A transport device comprising:
   a guide member;

a movable member adapted to move relative to said guide member in spaced guided engagement with said guide member;

plural fluid supply means for supplying pressurized fluid in a gap between said guide member and said movable member; and means for regulating the ratio of the change in dimension of said gap to the change in pressure of the fluid supplied by said plural fluid supply means.

3. A semiconductor device producing apparatus comprising:

an illuminating unit;

a mask holder for supporting a mask bearing a circuit pattern for illumination by said illuminating unit;

a wafer holder for supporting a wafer onto which the circuit pattern of the mask, illuminated by said illuminating unit, is to be transferred; and a transport device for displacing at least one of said mask holder and wafer holder in order to transfer said circuit pattern to said wafer; said transport device including:

a guide member;

a movable member adapted to move relative to said guide member in spaced guided engagement with said guide member;

plural fluid supply means for supplying pressurized fluid in a gap between said guide member and said movable member; and means for regulating the ratio of the change in dimension of said gap to the change in pressure of the fluid supplied by said plural fluid supply means.

4. A bearing apparatus comprising:

a shaft;

a bearing supported in spaced relation on said shaft;

plural fluid supplying means for supplying pressurized fluid between said shaft and said bearing; and control means for controlling the pressure of the pressurized fluid supplied from said fluid supplying means, said control means performing a first control for changing the pressure of the fluid supplied by each of said fluid supplying means while maintaining the sums of the pressures of the fluid supplied by all of said fluid supplying means constant, and performing a second control for changing the sum of pressures of the fluid supplied by all of said fluid supplying means.

5. A bearing apparatus according to claim 4, wherein said control means controls the sensitivity of said bearing, which is defined as the ratio of the change in dimension of the distance between said shaft and said bearing to the change in pressure of said supplied fluid supplied by said plural supply means.

6. A bearing apparatus according to claim 5, wherein at least two of said fluid supplying means are positioned opposite one another relative to said shaft and wherein said control means increases the sensitivity by decreasing the sum of the pressures of the fluid supplied from said two of said fluid supplying means.

7. A bearing apparatus according to claim 5, wherein at least two of said fluid supplying means are positioned opposite one another relative to said shaft and wherein said control means decreases the sensitivity by increasing the sum of the pressures of the fluid supplied from said two of pair of said fluid supplying means.

* * * * *

UNITED STATES PATENT AND TRADEMARK OFFICE
CERTIFICATE OF CORRECTION

PATENT NO. : 4,588,288

DATED : May 13, 1986

INVENTOR(S) : Nakasugi et al.

It is certified that error appears in the above-identified patent and that said Letters Patent is hereby corrected as shown below:

Column 1, line 44, change "sub-micron" to --submicron--.

Column 3, line 38, change "in" to --is--;
          line 61, change "pressure" to --pressures--; and
          line 65, change "pressure" to --pressures--.

Column 4, line 18, change "requlated" to --regulated--.

Column 5, line 3, change "102" to --101--;
          line 5, change "101" to --102--; and
          line 10, change "bar" to --bars--.

Signed and Sealed this

Sixth Day of January, 1987

Attest:

DONALD J. QUIGG

Attesting Officer

Commissioner of Patents and Trademarks